(12) United States Patent
Chang et al.

(10) Patent No.: US 6,331,728 B1
(45) Date of Patent: Dec. 18, 2001

(54) HIGH RELIABILITY LEAD FRAME AND PACKAGING TECHNOLOGY CONTAINING THE SAME

(75) Inventors: Bo Soon Chang, Cupertino; Vani Verma, Sunnyvale, both of CA (US); Anthony Odejar, Laguna (PH)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/259,482

(22) Filed: Feb. 26, 1999

(51) Int. Cl.[7] ............................................ H01L 23/495
(52) U.S. Cl. ...................... 257/676; 257/666; 257/674
(58) Field of Search ................................. 257/676, 666, 257/674; 174/50.54, 52.4, 52.1, 52.2

(56) References Cited

U.S. PATENT DOCUMENTS

| | | | |
|---|---|---|---|
| 4,857,989 | 8/1989 | Mori et al. | 357/80 |
| 4,942,452 | 7/1990 | Kitano et al. | 357/68 |
| 5,378,656 | 1/1995 | Kajihara et al. | 437/217 |
| 5,750,153 | 5/1998 | Shibata | 425/116 |
| 5,763,829 | * 6/1998 | Tomita et al. | 174/52.2 |
| 5,811,875 | * 6/1998 | Jeong et al. | 257/672 |
| 6,144,088 | 11/2000 | Pohl et al. | 257/666 |

FOREIGN PATENT DOCUMENTS

| | | |
|---|---|---|
| 5-218275 | 8/1993 | (JP) . |
| 8-008388 | 1/1996 | (JP) . |

OTHER PUBLICATIONS

Plan views of leadframes made by Sony, Hitachi, NEC, Motorola and Toshiba, believed to be publicly available in Dec. 1996.

Plan views leadframes made by Micron Technology, believed to be publicly available in Dec. 1996.

* cited by examiner

*Primary Examiner*—Caridad Everhart

(57) ABSTRACT

A lead frame includes a first side rail, a second side rail spaced apart from the first side rail, a center rail disposed between the first side rail and the second side rail, and a plurality of package locations. Each package location includes a first and a second die attach paddle. The first die attach paddle supports a first side of a semiconductor die and is coupled only to the first side rail or to the second side rail. The second die attach paddle supports a second side of the semiconductor die and is coupled only to the center rail. The first and second die attach paddles are separate and unconnected to each other and may be generally circular in shape. An aggregate surface area of the first and second paddles may be less than about 25 percent of a surface area of the semiconductor die. By limiting the surface area of the interfaces between the lead frame and the silicon die and the surface area of the interfaces between the lead frame and the molding compound, moisture-related problems and problems related to the differing coefficients of thermal expansion (such as delamination and/or cracks, for example) of the constituent materials of the resultant semiconductor device are minimized.

13 Claims, 6 Drawing Sheets

HIGH RELIABILITY LEAD FRAME AND PACKAGING TECHNOLOGY CONTAINING THE SAME

BACKGROUND OF THE INVENTION

1. Field of the Invention

This invention relates to high-density lead frames, packaging technology containing such lead frames and methods of attaching a silicon die onto a lead frame. More particularly, the present invention relates to high-reliability lead frames and packaging methods that provide excellent resistance to moisture and moisture-related problems, such as delamination and warping.

2. Description of the Related Art

Semiconductor integrated circuits are usually mounted on lead frames, each circuit thereafter being encapsulated in a plastic package formed by an injection molding process. FIG. 1 shows an example of a first generation copper lead frame 100. The lead frame 100 includes a plurality of solid copper die-attach platforms 110. Each die-attach platform 110 is adapted to support a single semiconductor die (not shown). The die attach platforms 110 of the lead frame 100 have about the same dimensions as the semiconductor die they are designed to support. On either side of each die-attach platform 110 are leads 115. Each die-attach platform 110 is attached to one of the two lead frame side rails 105 as well as to the lead frame center rail 135. To attach the semiconductor dies onto the solid copper die-attach platforms 110, an adhesive (such as silver epoxy paste) is applied to each die-attach platform 110, and the semiconductor die is adhered thereon. A wire bonding process is then typically carried out to attach fine gold wires between the semiconductor die and the leads 115. The assembly is then enclosed in a mold and molding compound is injected therein to encapsulate the silicon die into the packages. The molding compound is injected at high temperature, most often at or around 175–185 degrees C, and thereafter cooled to room temperature. The resulting packages are then trimmed from the lead frames 100, the leads 112 appropriately bent and shaped, and the packages separated from one another in a singulation process.

The heating of the lead frame assembly to a temperature suitable for plastic injection molding and subsequent cooling to room temperature, however, causes problems that have been traced to the mismatch in the Coefficient of Thermal Expansion (hereafter "CTE") of the constituent materials of the semiconductor package. Indeed, the CTE of the silicon die is about 2.2 Parts Per Million per degree C (hereafter "PPM"/degree C), while the CTE of the plastic molding compound is about 8–12 PPM/degree C and that of the copper lead frame 100 is about 17 PPM/degree C. Due at least in part to these rather larger CTE mismatches, packages manufactured utilizing this or similar lead frame technologies tend to warp as the constituent materials thereof expand and shrink to differing extents and rates.

FIG. 6 depicts a side view of a semiconductor package 600 and the leads 115 protruding therefrom. After the high temperature plastic injection molding and subsequent cooling processes, the mismatch in the CTE between the semiconductor die, the plastic molding compound and the copper lead frame 100 causes the package 600 to warp as it cools to room temperature. The extent of this warpage is illustrated in FIG. 6 by the dimensional arrow labeled W, which represents a measure of the deformation undergone by the package 600 during the heating and/or cooling processes or during a subsequent high temperature process, such as a solder reflow process. The lead frame architecture shown in FIG. 1, for example, typically leads to a warpage measure W of about 4–5 mils for a Thin Outline Small Semiconductor Package (hereafter "TSOP") having a thickness of about 40 mils, or about 1 millimeter.

In an effort to mitigate the warping effects of the solid copper die attach platforms 110 shown in FIG. 1, the semiconductor industry turned to the lead frames having an architecture similar to that shown at 200 in FIG. 2. As shown in FIG. 2, the lead frame 200 includes die attach platforms 210 comprising platform cutouts 220 defining an "XX"-like shape, lead frame side rails 205 and a lead frame center rail 235. The cutouts 220 reduce the amount of copper platform material supporting the semiconductor die (not shown) and thus somewhat reduce the warpage W experienced by the resulting semiconductor package as it undergoes the plastic injection molding and cooling processes and/or other thermal cycling processes. As shown in FIG. 2, each die attach platform 210 is connected to one of the side rails 205 as well as to the center rail 235. Although an improvement over the lead frame architecture of FIG. 1, the lead frame of FIG. 2 still results in an unacceptable degree of warpage W, due to the large area interfaces and CTE mismatches between the copper lead frame 200, the molding compound and the silicon die.

In a further effort to control this warping phenomenon and the delamination and package cracking (internal and/or external) problems associated therewith, lead frame designers were drawn to design alternative lead frame configurations and die attach platforms, such as shown in FIG. 3. FIG. 3 shows a lead frame 300, including side rails 305, a center rail 335, leads 315 and die attach platforms 310 comprising platform interior supports 330 attached to platform frames 325. The platform frames 325 have about the same footprint as the die attach platforms 110 of FIG. 1, but with the interior portion thereof cut out to define the platform interior supports 330. The platform interior supports 330, as shown in FIG. 3, include a meshwork of paddles interconnected by thin wire-like runners. Each semiconductor die (not shown) is supported, therefore, by a platform frame 325 and by the platform interior supports 330 associated with the platform frame 325. These die attach platforms 310, although an improvement over the designs shown in FIGS. 1 and 2, nevertheless exhibit a significant degree of warpage W as a result of thermal cycling and the ingress and egress of moisture into and out of the resulting package. Indeed, the surface area of the die attach platforms 310 is still about 69% of the total surface area of the semiconductor die to be attached thereon. Therefore, a significant area of contact remains between the thermally mismatched copper die attach platform 310 and the silicon die, as well as between the copper die attach platform and the molding compound. Typically, the die attach platforms 310 of FIG. 3 leads to a warpage W of about 2–3 mils for a TSOP package having a thickness of about 40 mils and to significant delamination problems as the constituent materials of the resultant package expand and contract to differing degrees as the device cools.

Still further efforts to reduce the warpage W have led to the lead frame architecture shown in FIG. 4. As shown therein, the lead frame 400 includes lead frame side rails 405, a center rail 435, leads 415 and die attach platforms 410. Each die attach platform 410 has a generally "II"-like shape, configured as a pair of facing and spaced-apart platform runners (perpendicular to the side rails 405 and to the center rail 435) to support the silicon die (not shown). The facing and spaced apart runners of the die attach platform 410 define an empty space 420 therebetween. Whereas two of the sides of the silicon die are supported by the facing and spaced apart runners of the die attach platform 410, the middle portion of the die is suspended over the space 420. As with the die attach platforms of the lead frames of FIGS. 1, 2 and 3, the die attach platform 410 of FIG. 4 is attached to one of the side rails 405 as well as to the center rail 435. Despite a lower contact area between the copper die attach platform 410 and the silicon die and a lower contact area between the die attach platform 410 and the molding compound, the lead frame architecture of FIG. 4 still results in a warpage factor W of abut 2–4 mils for a 40 mils thick TSOP package, with the accompanying defects and delamination problems occasioned by such warpage.

Standard J-STD-020, "Moisture/Reflow Sensitivity Classification for Non-Hermetic Solid State Surface-Mount Devices", promulgated by JEDEC (Joint Electron Device Engineering Council), the semiconductor engineering standardization body of the Electronic Industries Alliance (EIA), is a widely accepted standard for measuring the moisture sensitivity of semiconductor packages made with moisture-permeable materials. Standard J-STD-020 (incorporated herein by reference in its entirety), and revisions thereof may be found at the JEDEC World Wide Web site, at URL http:\\www.jedec.org. This standard defines moisture levels that measure the reliability of the package relative to moisture. Currently, six MSL levels are defined, from Moisture Sensitive Level (hereafter "MSL")1 to MSL 6, with lower MSL numbers indicating high reliability and low moisture sensitivity and higher numbers indicating low reliability and high moisture sensitivity.

Semiconductor packages manufactured with the lead frame 100 of FIG. 1, after testing as per JEDEC standard J-STD-020, are typically assigned an MSL of 5, because of relatively high sensitivity to moisture, leading to possible subsequent delamination of the plastic from the die and/or from the lead frame, as well as internal or external package cracks (in extreme cases) as the moisture within the package attempts to outgas therefrom during solder reflow, for example. Similarly, the lead frame architectures of FIGS. 2, 3 and 4 are typically assigned an MSL of between 3 and 5, indicating a relatively high sensitivity to moisture, and pointing to the likelihood of significant moisture and thermal cycling-related problems, such as delamination, die lifting, internal cracks and like defect-inducing phenomena.

What is needed, therefore, are novel high reliability lead frames, packaging technologies and methods of attaching dies onto such novel high reliability lead frames that are less sensitive to moisture and to the problems associated with packages having high moisture sensitivities. Also needed are lead frames that reduce the warpage W of semiconductor devices as they undergo processes having a high thermal gradient such as, for example, reflow processes.

SUMMARY OF THE INVENTION

An object of the present invention, therefore, is to provide novel high reliability lead frames, packaging technologies and methods of attaching dies onto such novel high reliability lead frames that are less sensitive to moisture and to the problems associated with packages having high moisture sensitivities. A further object of the present invention is to provide lead frames that reduce the warpage W of semiconductor devices as they undergo thermal cycling.

In accordance with the above-described objects and those that will be mentioned and will become apparent below, a lead frame, according to an embodiment of the present invention, comprises:

a first side rail;

a second side rail spaced apart from said first side rail;

a center rail disposed between said first side rail and said second side rail;

a plurality of package locations, each package location comprising:

a first die attach paddle to support a first side of a semiconductor die, the first die attach paddle being coupled only to one of said first and second side rails; and a second die attach paddle to support a second side of the semiconductor die, the second die attach paddle being coupled only to said center rail.

The first and second die attach paddles may be generally circular in shape. The aggregate surface area of the first and second die attach paddles may be less than about 25 percent of a surface area of the semiconductor die. Each of the first and second die attach paddles may be attached to the first side rail, the second side rail or to the center rail by a paddle support. The paddle support may include a pair of support arms. The largest dimension of each of the first and second die attach paddles may be smaller than the smallest side dimension of the semiconductor die. The first and second die attach paddles may be adapted to support only a first pair of facing sides of the semiconductor die, a second pair of facing sides thereof being unsupported by the first and second die attach paddles. The lead frame may be formed of or include copper or alloys thereof Other materials having lesser degree of thermal mismatching between it and the silicon die and/or the molding compound may be used. However, such other materials may have poor thermal dissipation characteristics and may require changes to the lead frame design, the plastic injection molding machine and/or the trim form tooling.

According to another embodiment, the present invention may be regarded as a semiconductor device, comprising:

a first generally circular die attach paddle;

a second generally circular die attach paddle, said second die attach paddle being unconnected to and disposed apart from said first die attach paddle;

a semiconductor die attached to and supported by the first and second die attach paddles;

a plurality of leads, each electrically connected to said semiconductor die;

a package encapsulating said first and second paddles and said semiconductor die, the package leaving a portion of each of the plurality of leads protruding therefrom.

The aggregate surface area of the first and second die attach paddles may be less than about 25 percent of a surface area of the semiconductor die. The largest dimension of each of the first and second die attach paddles may be smaller than a smallest side dimension of the semiconductor die. The first and second die attach paddles may be adapted to support only a first pair of facing sides of the semiconductor die, a second pair of facing sides thereof being unsupported by said first and second die attach paddles. Each of the first and second die attach paddles may include a paddle support connected thereto. The paddle support may include a pair of support arms. The first and second die attach paddles may include copper or alloys thereof.

The present invention is also a method of packaging a semiconductor die, comprising the steps of:

mounting the semiconductor die onto a lead frame including, at each package location thereof, a plurality of leads and a pair of separate die attach paddles, an aggregate surface area of the pair being less than about 25 percent of a surface area of the semiconductor die;

wire bonding the semiconductor die to the plurality of leads; and encapsulating the semiconductor die in molding compound.

The mounting step may include a step of applying an adhesive, such as silver epoxy paste, for example, to each die attach paddle of the pair of die attach paddles. Each of the die attach paddles of the pair of die attach paddles may include copper or alloys thereof Each of the die attach paddles of the pair of die attach paddles may be attached to the lead frame by a paddle support.

BRIEF DESCRIPTION OF THE DRAWINGS

For a further understanding of the objects and advantages of the present invention, reference should be made to the following detailed description, taken in conjunction with the accompanying figures, in which.

DESCRIPTION OF THE PREFERRED EMBODIMENTS

Figure 1:
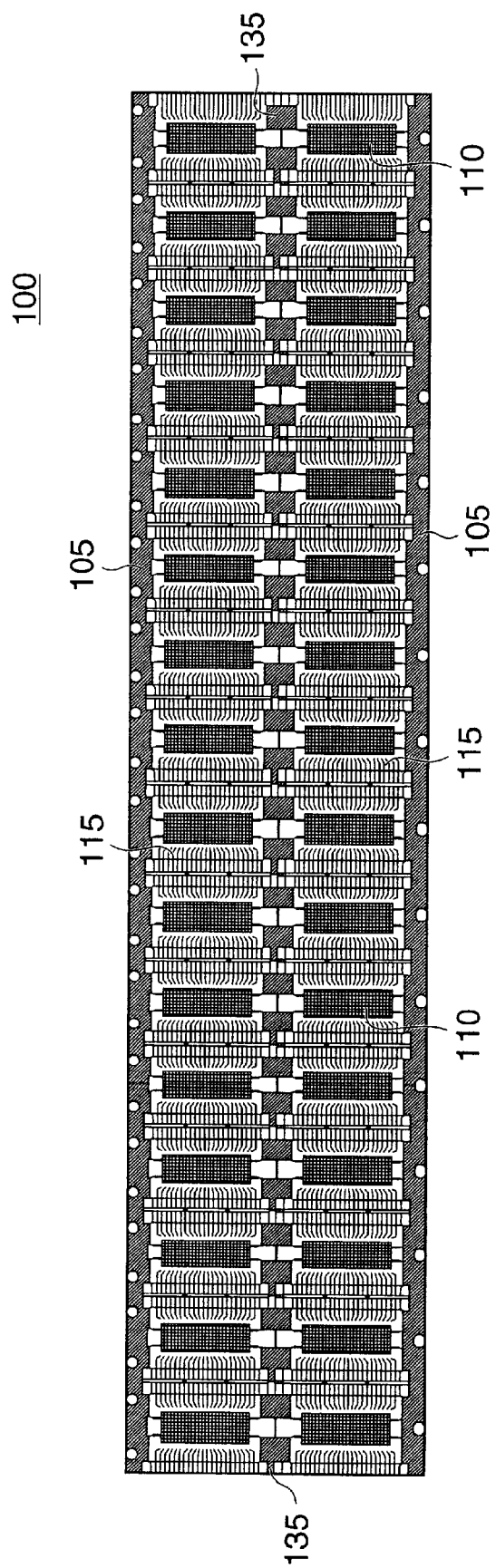
FIG. 1 shows a lead frame including solid copper die attach platforms.
Figure 2:
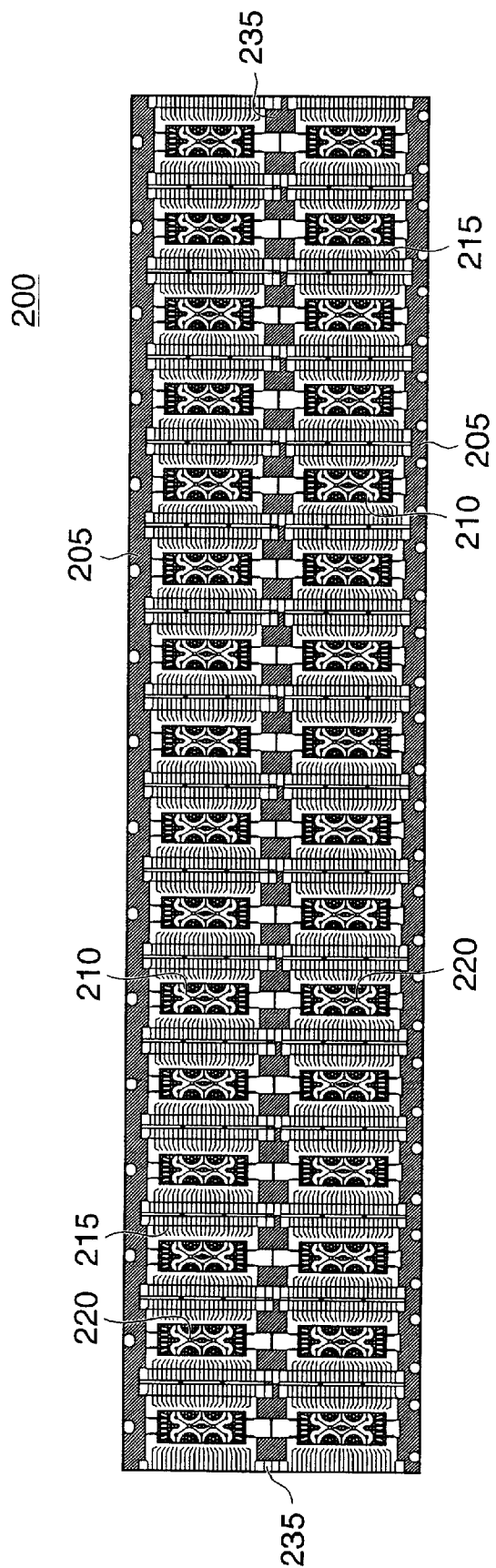
FIG. 2 shows a lead frame including die attach platforms having cutouts therein.
Figure 3:
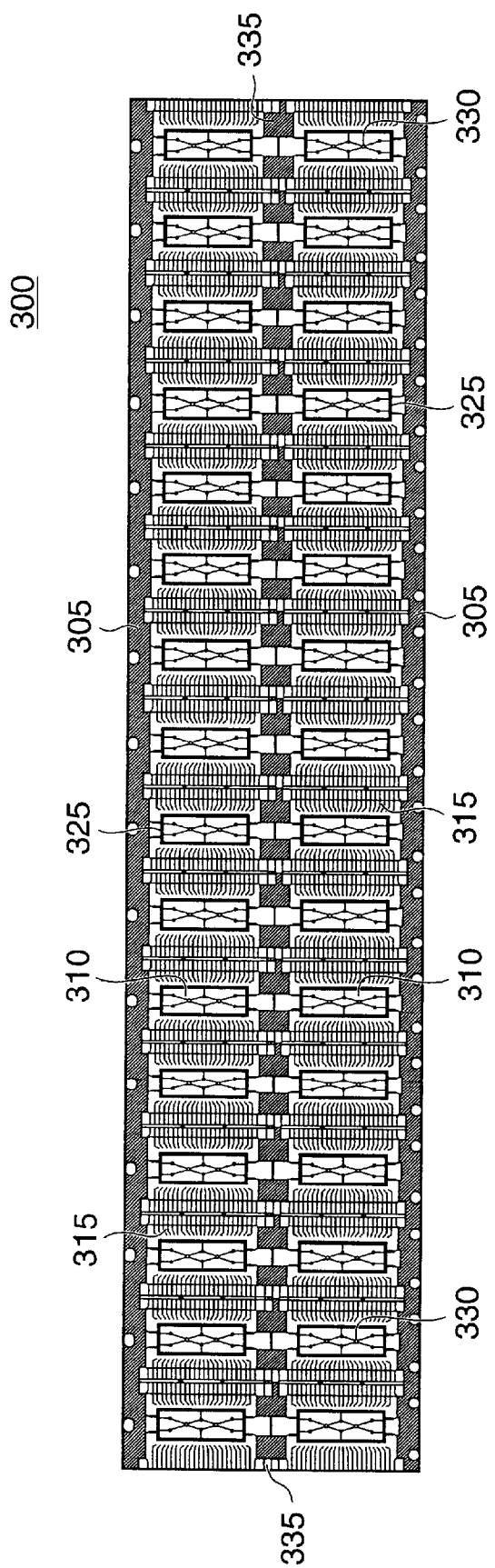
FIG. 3 shows a lead frame including die attach platforms having platform frames and platform interior supports.
Figure 4:
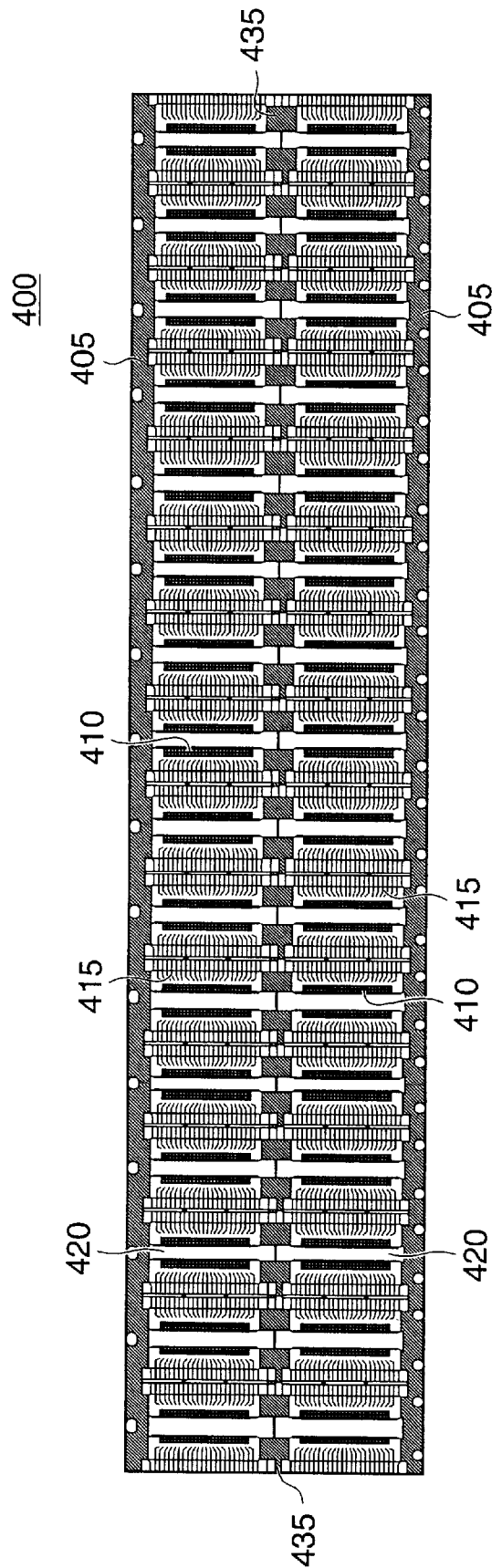
FIG. 4 shows a lead frame including die attach platforms having II-shaped platform runners.
Figure 5:
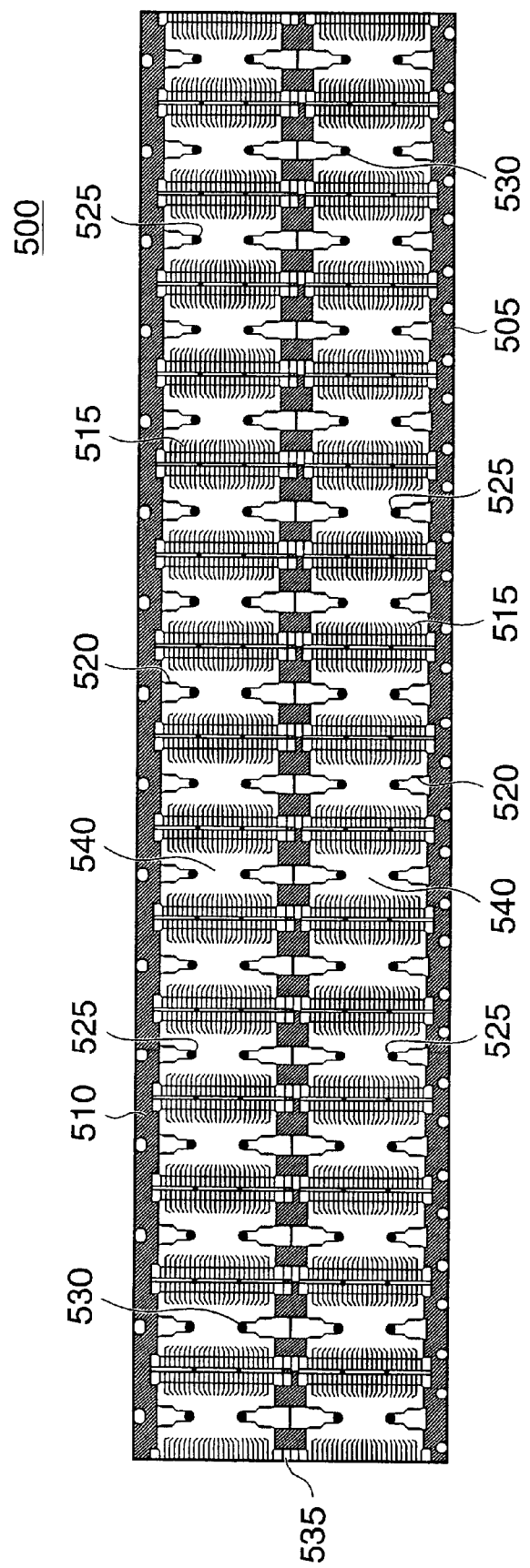
FIG. 5 shows a lead frame according to an embodiment of the present invention.
Figure 6:
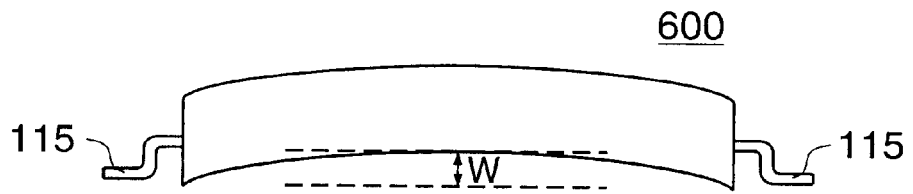
FIG. 6 shows a side view of a semiconductor package to illustrate the warping problem associated with devices exhibiting a high sensitivity to moisture.

FIG. 5 shows a high-reliability lead frame 500 according to an embodiment of the present invention. As shown therein, the high reliability lead frame 500 includes a first side rail 505 and a second side rail 510 parallel to and spaced apart from the first side rail 505. A center rail 535 is disposed between the first and second rails 505, 510. The lead frame 500 defines a plurality of package locations 540, and each package location 540 may include a first die attach paddle 525, a second die attach paddle 530 and a plurality of leads 515 that form the leads of the semiconductor device to be subsequently formed. The first and second die attach paddles 525, 530 are each configured to support one end of a semiconductor die (not shown in FIG. 5, but shown in dashed lines at reference numeral 740 in FIG. 7). As shown in FIG. 5, the first die attach paddle 525 of each package location 540 is coupled (attached to and integral with, for example) only to one of the first and second side rails 505, 510 by a paddle support 520. The second die attach paddle 530 of each package location 540, on the other hand, is coupled (attached to and integral with, for example) only to the center rail 535, by a paddle support 520. Unlike the lead frames shown in FIGS. 1–4, the structures shown in FIG. 5 that support the silicon die are not attached to both a side rail and to a center rail. Indeed, in FIG. 5, the die attach paddles 525, 530 are either attached to one of the side rails 505, 510 or to the center rail 535, but not to both. The die attach paddles 525, 530 of FIG. 5 are separate and distinct from one another, each being attached to and supported by only one of the side and center rails 505, 510 and 535.

The paddle support 520 may include a pair of support arms, one end of each of the support arms of the pair being attached to one side of the first die attach paddle 525, 530 and the other end thereof being attached to the first side rail 505, the second side rail 510 or the center rail 535. Other configurations for the paddle supports 520 may be implemented within the context of the present invention, as long as the functionality of the paddle supports 520 is preserved; namely, to support the die attach paddles 525, 530 and to do so with a minimum of surface area. Minimizing the surface area of the first and second die attach paddles 525, 530 and the surface area of the paddle supports 520 minimizes the surface area of the silicon to paddle interfaces between the first and second die attach paddles 525, 530 and the silicon die to be attached thereto and minimizes the paddle support to molding compound interfaces between the paddle supports 520 and the molding compound of the semiconductor package to be formed. In turn, minimizing these interfaces minimizes delamination and other moisture and thermal-induced mechanical and electrical problems related to the differing CTEs of the silicon die, the lead frame material and the molding compound. The lead frame, according to the present invention, may be made of copper or a copper-containing alloy. Alternatively, the lead frame according to the present invention may be made of other material(s), such as, for example, an alloy of iron and 42% nickel. Forming the lead frame of such an iron-nickel alloy causes the resulting lead frame to exhibit less thermal mismatching between the silicon die and the lead frame. However, such an iron-nickel alloy also suffers from poor thermal dissipation, relative to copper and/or copper alloys. Indeed, the thermal conductivity of such an alloy of iron and 42% nickel is about 0.035 Cal/cm.sec°C., whereas the thermal conductivity of a suitable copper alloy is about 0.41 Cal/cm.sec°C. The lead frame according to the present invention may be made of or include other materials, the present invention not being limited to those materials specifically listed herein.

The first and second die attach paddles 525, 530, according to an embodiment of the present invention, may be generally circular in shape. Selecting a circular shape for the die attach paddles 525, 530 avoids the corner stress problems that may be encountered if die attach paddles having other shapes (rectangular, for example) were to be employed. To minimize the surface area of the interface between the paddles 525, 530 and the silicon die to be adhered thereon while providing adequate mechanical support therefor, the size of the first and second paddles 525, 530 may be selected such that the aggregate surface area thereof for each package location 540, is between about 25 percent and about 2 percent of the surface area of one side (eg., the footprint) of the semiconductor die. Preferably, the size of the first and second paddles 525, 530 may be selected such that the aggregate surface area thereof, for each package location 540, may be selected between about 12 percent and about 4 percent of the surface area of the semiconductor die, and more preferably between about 10 percent and about 6 percent of the surface area of the semiconductor die. For example, the size of the first and second paddles 525, 530 may be selected such that the aggregate surface area thereof, for each package location 540, may be about 8 percent of the surface area of the semiconductor die to be mounted at that package location 540. The aggregate size of the die attach paddles 525, 530 may be selected to be as small as practicable to effectively attach the semiconductor die thereon. Alternatively, the size of the die attach paddles 525, 530 may be selected to be as large as practicable, as long as unacceptable CTE-related problems do not appear. The present invention prevents or minimizes many of the CTE-related problems associated with the lead frames shown in FIGS. 1–4 by limiting the surface area of contact between the silicon die and the paddles 525, 530 to a minimum and by minimizing the surface area of the paddles 525, 530 themselves, as the CTE differential between the lead frame 500 (made of copper, for example) and the silicon die is believed to be a major contributor to moisture and thermal-related mechanical and electrical (and hence reliability) problems. Another major contributor to such problems is the interface between the lead frame material and the molding compound. Minimizing the size of the lead frame material by configuring the first and second paddles 525, 530 and associated paddle supports 520 according to the present invention also minimizes moisture and thermal-related problems at the interfaces between the lead frame material and the molding compound that forms the packaging of the semiconductor device.

To mount a semiconductor die at a package location 540, silver epoxy paste, or some other suitable adhesive, is applied to the first and second die attach paddles 525, 530, and the semiconductor die placed thereon. As the first and second die attach paddles 525, 530 have a small surface area, the greater surface area of the semiconductor die may overlap the boundaries of the paddles 525, 530. Indeed, the largest dimension (the diameters thereof, in the case of generally circular die attach paddles 525, 530) of each of the first and second die attach paddles 525, 530 may be smaller than the smallest side dimension of the semiconductor die. For example, the short axis of the semiconductor die may be larger than the largest dimension of the paddles 525, 530. When supported by the die attach paddles 525, 530 of the embodiment of the present invention shown in FIG. 5, the semiconductor die may be solely supported by the die attach paddles 525, 530, there being no support of the die between the two paddles 525, 530, nor at the sides of the package location 540 parallel to the long axis of the die, unlike the platform frame 325 shown in FIG. 3. In this manner, the first and second die attach paddles 525, 530 are adapted to support only a first pair of facing sides of the semiconductor die, the second pair of facing sides thereof being unsupported by the first and second die attach paddles 525, 530.

After a semiconductor die is mounted to each pair of the die attach paddles 525, 530 at each of the package locations 540, a heater block is used to heat the dies directly from the bottom to carry out the wire bonding process. The heater block preferably conforms to the shape of the die and the paddle 525, 530 assembly, to ensure optimum heat transfer to the semiconductor die during the wire bonding process. Thereafter, conventional plastic injection molding techniques may be employed to encapsulate the semiconductor die and lead frame prior to singulation of the resultant device from the lead frame 500 and the bending and shaping of the leads 515.

For a semiconductor die having dimensions of about 191 mils by about 583 mils, for example, the die attach paddles according to the present invention may be dimensioned to have a diameter of about 1.905 millimeters. It is to be understood, however, that die attach paddles of lesser or greater diameter may also be implemented, the present invention not being limited to the exemplary dimensions given herein. In this case, encapsulating the die and die attach paddles 525, 530 in a thin TSOP package having a thickness of less than about 1.4 millimeters, the lead frame 500 according to the embodiment of the present invention shown in FIG. 5 exhibits less than about 2 mils in warpage, on average, and generally between 1 and 2 mils, after the die attach and plastic molding processes are carried out. According to the JEDEC J-STD-020 standard, the above-described thin TSOP package rated an MSL rating of between 1 and 3, having passed the MSL 3 criteria in every case. The present invention exhibits reliable results in the thermal stress test after the moisture soaking preconditioning test outlined in the JEDEC J-STD-020 standard. Using the lead frame 500 according to the present invention, no delamination is observed after moisture level 1 test, per JEDEC J-STD-020 standard.

The small area of the interfaces between the lead frame material and the silicon die and the small area of the interfaces between the lead frame material and the molding compound, according to the present invention, allow for a lower warpage factor W than is believed to have been previously possible using lead frame architectures similar to those shown in FIGS. 1–4. Consequently, the present invention allows for the use of silicon dies of larger size, without the same warpage, delamination and other CTE mismatch-related problems generally observed with conventional lead frame architectures.

Figure 7:
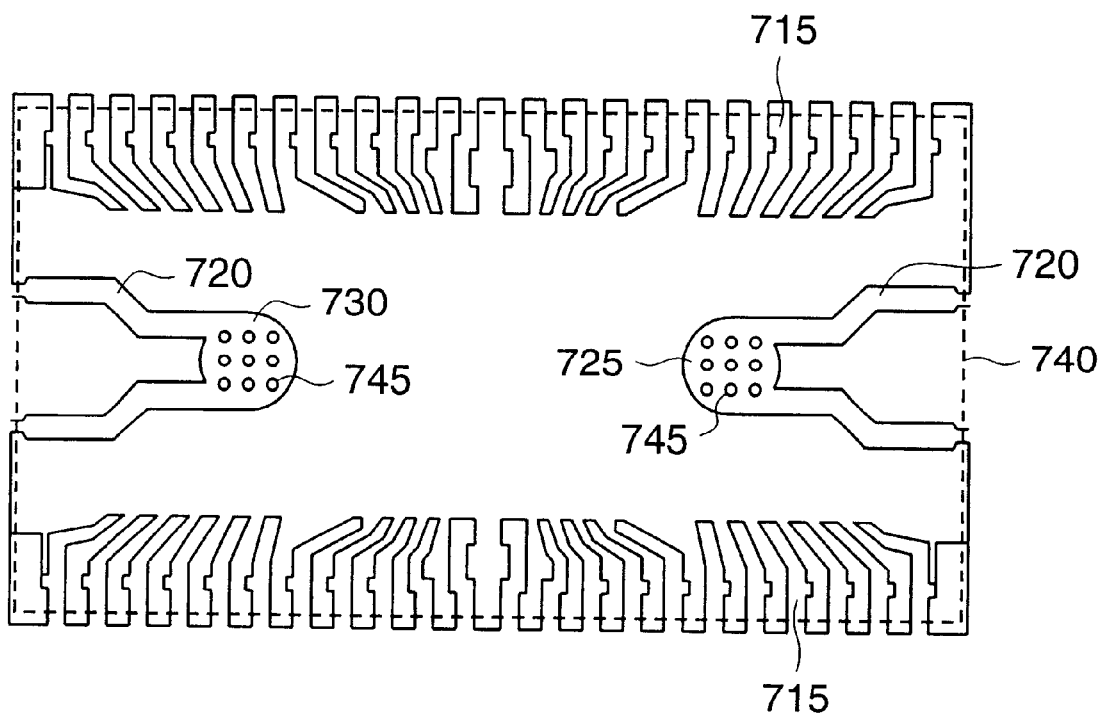
FIG. 7 shows a plan view of a package location 540 of the lead frame of FIG. 5 showing a configuration of the die attach paddles according to an embodiment of the present invention.

FIG. 7 shows a plan view of a package location 540 of the lead frame 500 of FIG. 5, to illustrate a configuration of the die attach paddles 525, 530 according to the present invention. The semiconductor die, mounted to a first die attach paddle 725 and to a second die attach paddle 730, is shown in dashed lines at reference numeral 740. The semiconductor (silicon, for example) die 740 is mounted onto the die attach paddles 725, 730 by placing a layer of adhesive such as silver epoxy paste (or any other suitable adhesive) thereon and pressing the die against the die attach paddles 725, 730. The die attach paddles 725, 730 may be supported by paddle supports 720, which connect the die attach paddles 725, 730 to either the first side rail 505, the second side rail 510 or to the center rail 535, all shown in FIG. 5. The die attach paddles 725, 730 may include dimples 745 to better allow the silver epoxy paste and/or the semiconductor die to adhere thereon.

While the foregoing detailed description has described preferred embodiments of the present invention, it is to be understood that the above description is illustrative only and not limiting of the disclosed invention. For example, the dimensions and/or shapes of the die attach paddles may differ from those described herein. Still other modifications may occur to those of skill in this art. Thus, the present invention is to be limited only by the claims as set forth below.

What is claimed is:

1. A lead frame comprising:
    a first side rail;
    a second side rail spaced apart from said first side rail;
    a center rail disposed between said first side rail and said second side rail;
    a plurality of package locations, each package location comprising:
        a first die attach paddle to support a first side of a semiconductor die, the first die attach paddle being coupled only to one of said first and second side rails; and
        a second die attach paddle to support a second side of the semiconductor die, the second die attach paddle being coupled only to said center rail.

2. The lead frame of claim 1, wherein said first and second die attach paddles are generally circular in shape.

3. The lead frame of claim 1, wherein an aggregate surface area of the first and second die attach paddles is less than about 25 percent of a surface area of the semiconductor die.

4. The lead frame of claim 1, wherein each of the first and second die attach paddles is attached to the first side rail, the second side rail or to the center rail by a paddle support.

5. The lead frame of claim 4, wherein the paddle support includes a pair of support arms.

6. The lead frame of claim 1, wherein a largest dimension of each of the first and second die attach paddles is smaller than a smallest side dimension of the semiconductor die.

7. The lead frame of claim 1, wherein the first and second die attach paddles are adapted to support only a first pair of facing sides of the semiconductor die, a second pair of facing sides thereof being unsupported by said first and second die attach paddles.

8. The lead frame of claim 1, wherein the lead frame includes copper or an alloy thereof.

9. A semiconductor device, comprising:
- a first generally circular die attach paddle;
- a second generally circular die attach paddle, said second die attach paddle being unconnected to and disposed apart from said first die attach paddle;
- a semiconductor die attached to and supported by the first and second die attach paddles;
- a plurality of leads, each electrically connected to said semiconductor die; and
- a package encapsulating said first and second paddles and said semiconductor die, the package leaving a portion of each of the plurality of leads protruding therefrom,
- wherein each of the first and second die attach paddles includes a paddle support connected thereto, each paddle support including a pair of support arms.

10. The semiconductor device of claim 9, wherein an aggregate surface area of the first and second die attach paddles is less than about 25 percent of a surface area of the semiconductor die.

11. The semiconductor device of claim 9, wherein a largest dimension of each of the first and second die attach paddles is smaller than a smallest side dimension of the semiconductor die.

12. The semiconductor device of claim 9, wherein the first and second die attach paddles are adapted to support only a first pair of facing sides of the semiconductor die, a second pair of facing sides thereof being unsupported by said first and second die attach paddles.

13. The semiconductor device of claim 9, wherein the first and second die attach paddles include copper or an alloy thereof.

* * * * *